United States Patent [19]
Berman et al.

[11] Patent Number: 4,857,865
[45] Date of Patent: Aug. 15, 1989

[54] SELF EQUALIZING MULTI-STAGE RADIO FREQUENCY POWER AMPLIFIER

[75] Inventors: Arnold L. Berman, Los Angeles; Carl J. Hahn, III, Inglewood; Marvin R. Wachs, Woodland Hills, all of Calif.

[73] Assignee: Hughes Aircraft Company, Los Angeles, Calif.

[21] Appl. No.: 269,840

[22] Filed: Nov. 10, 1988

[51] Int. Cl.⁴ .............................................. H03F 3/191
[52] U.S. Cl. .................................. 330/304; 330/149; 330/311
[58] Field of Search ............... 330/149, 151, 262, 274, 330/275, 286, 287, 302, 303, 304, 305, 306, 311; 455/114

[56] References Cited

U.S. PATENT DOCUMENTS

| | | | |
|---|---|---|---|
| 3,794,920 | 2/1974 | Darrow | 455/114 X |
| 3,805,164 | 4/1974 | Callaway | 330/306 X |
| 4,217,554 | 8/1980 | Brzozowski | 330/151 X |

Primary Examiner—Steven Mottola
Attorney, Agent, or Firm—Mark J. Meltzer; A. W. Karambelas

[57] ABSTRACT

Linearity and efficiency of a radio frequency multi-stage power amplification device 10 are increased by employing two tuned circuits 16 and 18 in the driver stage 12 and two tuned circuits 22 and 24 in the high power stage 14. After selecting elements of tuned circuits 22 and 24 in order to optimize the high power stage 14 for efficiency, linearity, and power output, elements are selected for tuned circuits 16 and 18 in order to cause the intermodulation output components associated with the driver state 12 to have a 180° phase angle relative to the intermodulation output components associated with the high power stage 14. This phase angle relationship will cause the intermodulation output component products from the driver 12 and high power stages 14 to cancel.

16 Claims, 3 Drawing Sheets

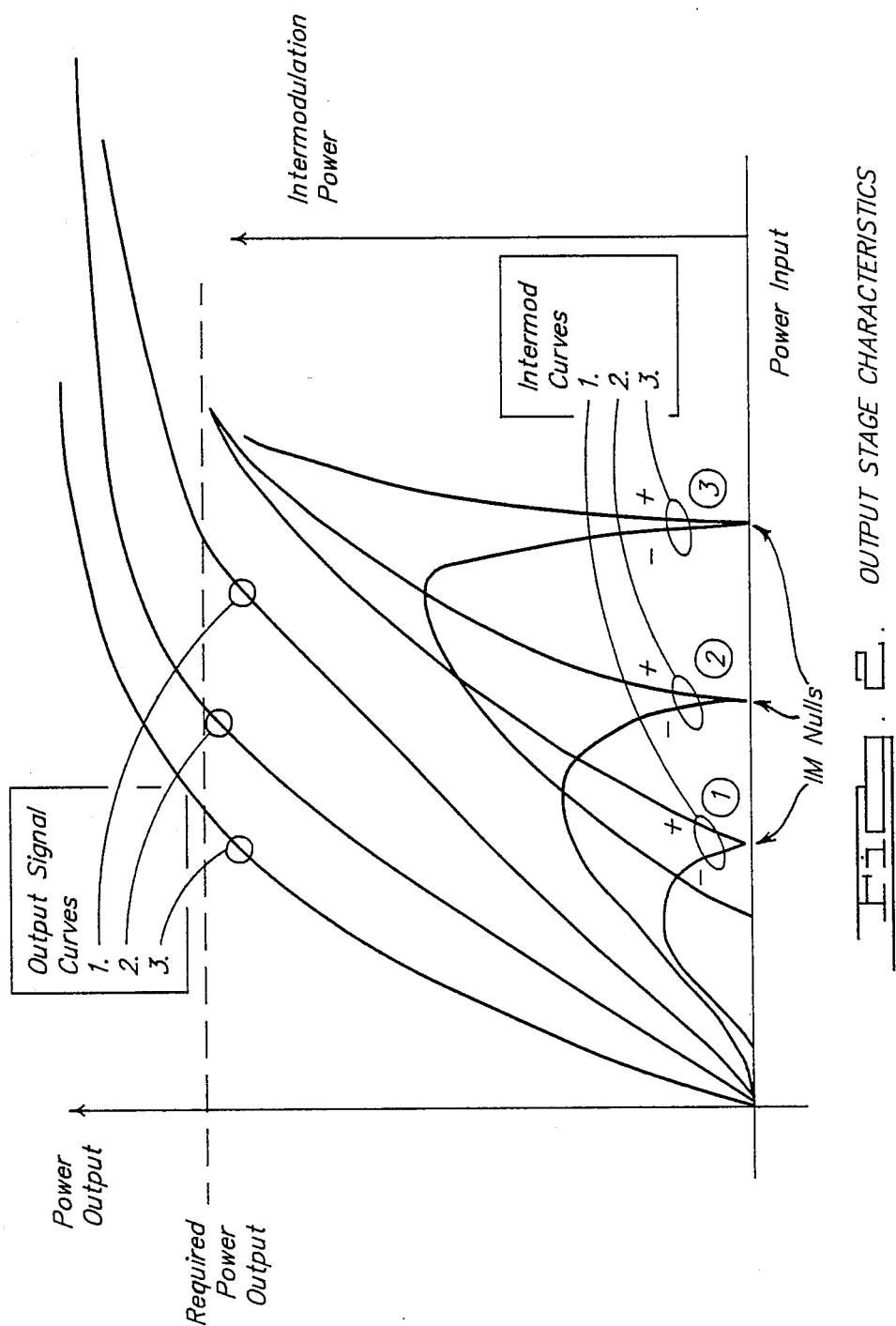
FIG. 2. OUTPUT STAGE CHARACTERISTICS

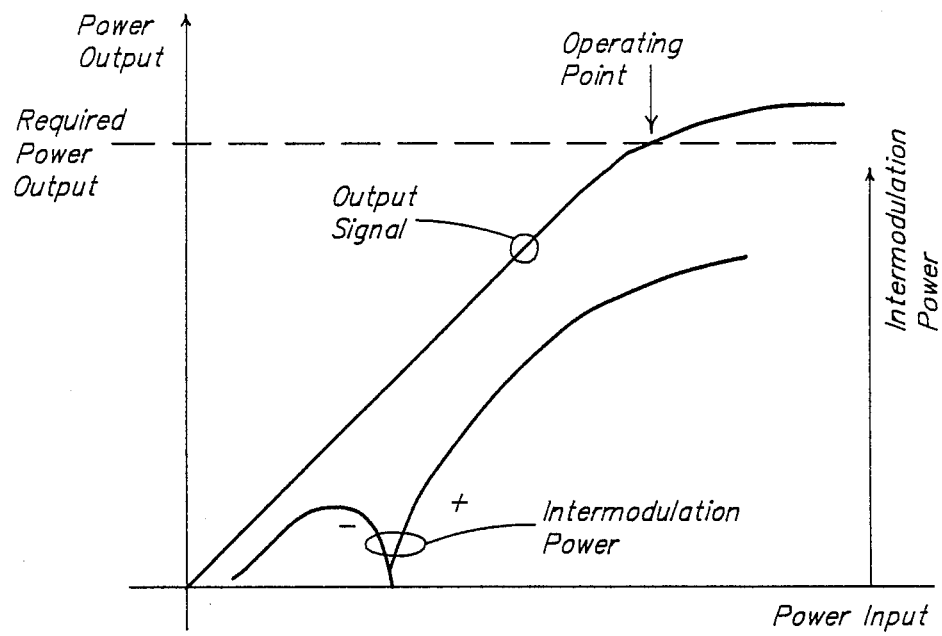
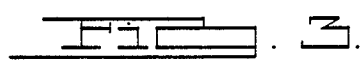
FIG. 3. DRIVER STAGE CHARACTERISTICS
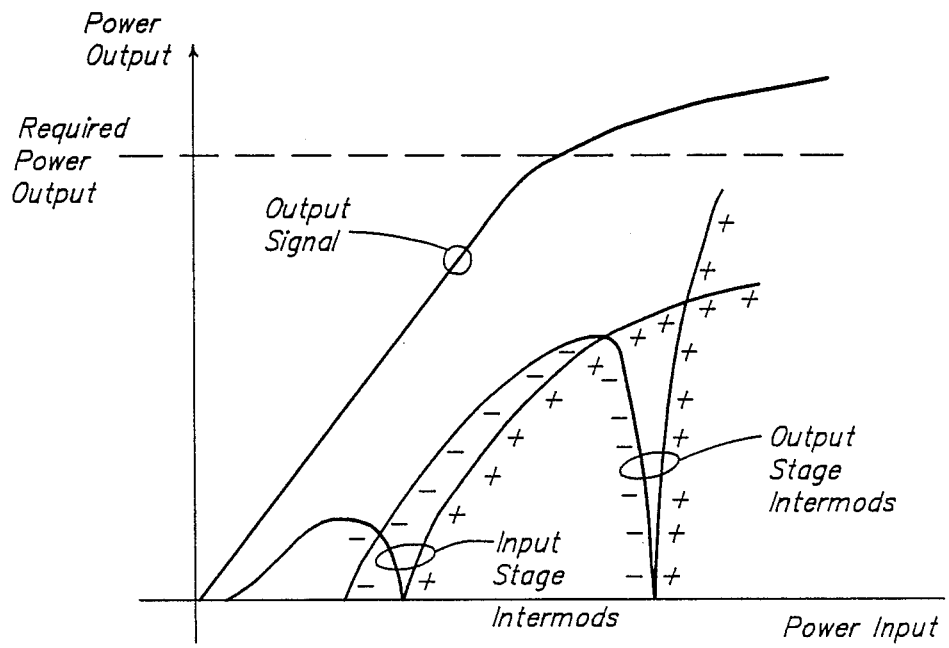
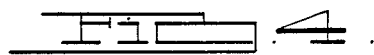
FIG. 4. TWO STAGE CHARACTERISTICS

SELF EQUALIZING MULTI-STAGE RADIO FREQUENCY POWER AMPLIFIER

BACKGROUND OF THE INVENTION

1. Field of the Invention

This invention relates to radio frequency power amplifiers and, more particularly, to a method to be used within a radio frequency multi-stage power amplifier to increase linearity and efficiency of the amplifier.

2. Discussion

Multi-stage radio frequency power amplifiers are used in a wide variety of communications and other electronic applications. These amplifiers are made up of two or more cascaded amplifier stages, each of which increases the level of the signal applied to the input of that stage by an amount known as the stage gain. The multi-stage amplifier output is therefore a replica of the input signal increased by the product of the stage gains. Ideally the input to output transfer of each stage would be linear; a perfect replica of the input signal, increased in amplitude, would appear at the amplifier output. Practical amplifiers, however, have a degree of non-linearity in their transfer characteristic. This non-linearity results in the distortion of the output signal so that it is no longer a perfect amplified replica of the input. One manifestation of this distortion is the creation of spurious signal components, known as intermodulation products, at frequencies which did not exist at the original input. These intermodulation components have a deleterious effect on the performance of the system employing the power amplifiers.

Two principal approaches have previously been used to increase linearity and thereby reduce the generation of intermodulation products. The first is the class A operation of each of the amplifier stages. This class of operation features the highest linearity but is often impractical because of its very poor efficiency and high thermal dissipation characteristics. The second conventional approach is the employment of separate linearizer circuits. Feed-forward, feed-back, and pre-distortion linearizers are conventionally utilized for this application. The separate linearizer approach suffers from several significant disadvantages. It significantly increases the cost of the amplifier and requires complex tuning and alignment to track the inherent variations of the amplifier over time and environmental changes. Additionally, the degree of linearization possible with a multi-stage amplifier is limited by the non-linear combination of the distortions generated by each stage.

The present invention overcomes the inherent disadvantages of the conventional approaches. The amplifier is designed so that the intermodulation components generated in each pair of cascaded stages are of opposite phase. In this manner the intermodulation components will combine subtractively thereby reducing the component level over the range of operation of the amplifier.

SUMMARY OF THE INVENTION

According to the teachings of the present invention, linearity and distortion of the radio frequency multi-stage power amplifier is improved by employing circuit means for internally causing the intermodulation output components associated with the individual stages to be 180° out of phase thereby resulting in cancellation.

The method to be utilized in eliminating the intermodulation output components associated with this multi-stage radio frequency power amplifier employs generally two steps. In the first step, the high power output stage is optimized for efficiency, linearity, and power output. This optimization procedure incorporates the following steps: (1) selection of the amplifier device (transistor); (2) selection of the amplifier device bias voltages; (3) design of the input and output tuned matching circuits; and (4) design of the bias circuits. After this optimization is completed, step two employs the appropriate selection of values of elements defining the input and output tuned circuits associated with the driver stage of the multi-stage radio frequency power amplifier. By appropriate element selection of these tuned circuits, the intermodulation output components associated with the driver stage will be out of phase with the high power stage intermodulation components.

BRIEF DESCRIPTION OF THE DRAWINGS

The various advantages of the present invention will become apparent to those skilled in the art by reading the following specification and by reference to the drawings in which:

FIG. 2 is a graphical illustration helpful in understanding the tuning of the output stage in accordance with the teachings of the preferred embodiment of the invention;

FIG. 3 is a graphical illustration of the output power level and associated intermodulation power level and phase angle of the driver stage after tuning in accordance with the teachings of this invention; and FIG. 4 is a graphical illustration of the power level and phase angle associated with the intermodulation components of the output and driver states of the amplifier for a given output power signal after the method of this invention has been performed.

DESCRIPTION OF THE PREFERRED EMBODIMENT

Figure 1:
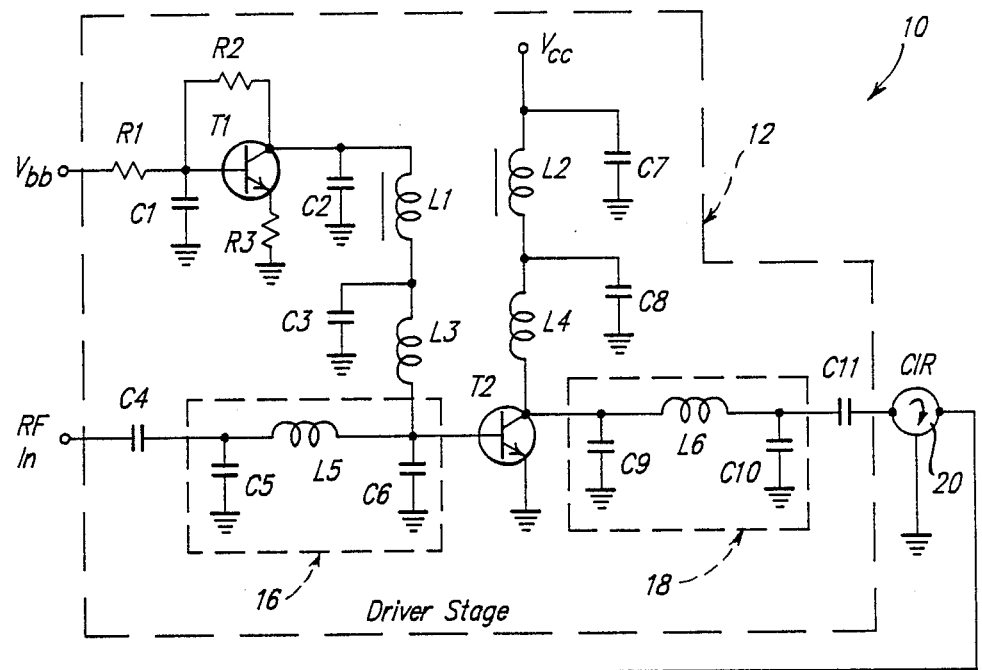
FIG. 1 is an electronic schematic circuit diagram of a two stage radio frequency power amplification device made in accordance with the teachings of the preferred embodiment of this invention.
Figure 1:
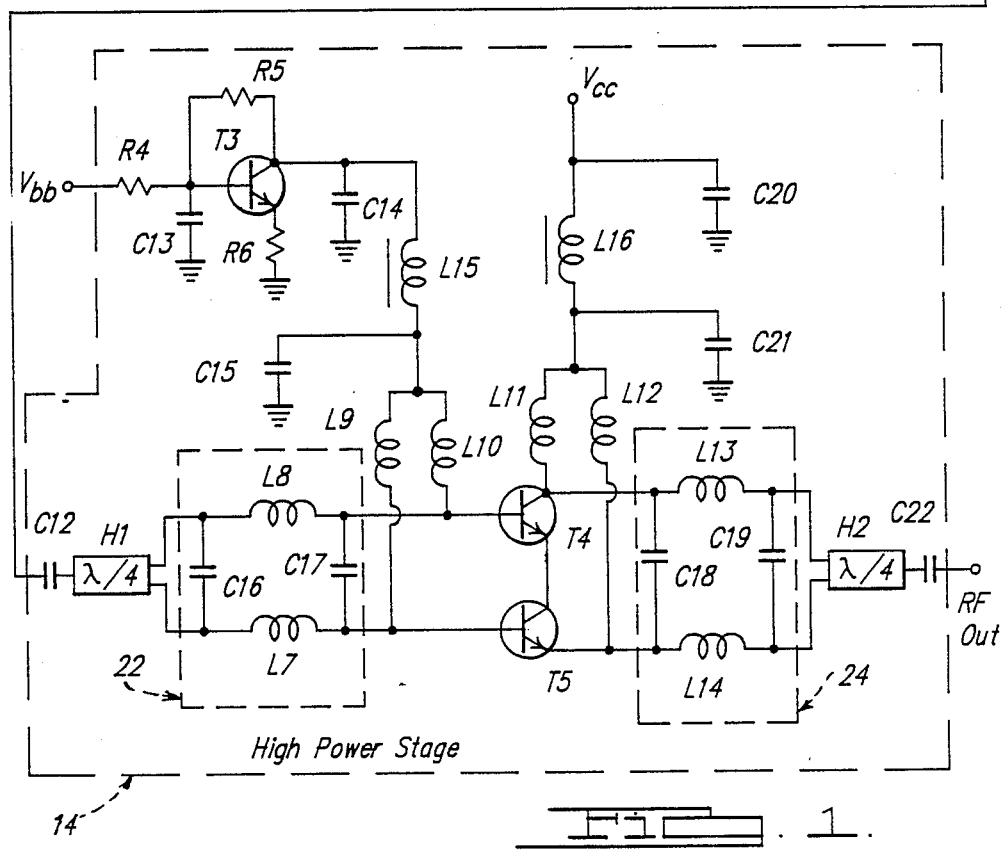

Turning now to FIG. 1, a two stage amplifier 10 having a driver stage 12 and a high power output stage 14 is illustrated. Radio frequency signals are input into amplifier 10 through capacitor $C_4$. The purpose of $C_4$ is to act as a direct current block. Further traversing the device, the signal then goes through the first input tuned circuit 16 associated with the driver stage 12. This input tuned circuit 16 consists of inductor $L_5$, and capacitors $C_5$ and $C_6$. Transistor $T_2$ amplifies the input signal and passes it to the input of the output tuned circuit 18.

Direct current voltage $V_{bb}$ is impressed on resistor $R_1$. The combination of resistors $R_1$, $R_2$, and $R_3$ along with capacitor $C_1$ acts to bias transistor $T_1$. Voltage appears at the collector of $T_1$ and is transferred to the base of transistor $T_2$ for biasing purposes. This transfer of collector voltage from transistor $T_1$ is effectuated by means of inductors $L_1$ and $L_3$. Capacitors $C_2$, $C_3$, acts as alternating current shunts to ground. The collector of transistor $T_2$ is biased by direct current voltage $V_{cc}$ via inductors $L_2$ and $L_4$. Capacitors $C_7$ and $C_8$ act as alternating current shunts to ground.

The output tuned circuit 18 associated with the driver stage 12 is defined by inductor $L_6$, and capacitors $C_9$ and $C_{10}$. Capacitor $C_{11}$ acts as a direct current block and connects the output of the driver stage to the circulator device 20. The circulator provides radio frequency isolation between the driver stage 12 and the high power stage 14 of the radio frequency power amplifier 10.

The output of the circulator device is connected to capacitor $C_{12}$ which acts as a direct current block. The output of capacitor $C_{12}$ goes into hybrid circuit designated as $H_1$. This hybrid circuit takes the single ended output of capacitor $C_{12}$ and converts this output to a balanced signal. The output of hybrid circuit $H_1$ serves as the dual input to the input tuned circuit of the high power output stage 14. The input tuned circuit 22 associated with the high power stage 14 is made up of inductors $L_7$ and $L_8$ and capacitors $C_{16}$ and $C_{17}$. The amplification device associated with the high power stage is a push-pull dual transistor arrangement of $T_4$ and $T_5$.

Transistor $T_3$ is biased by means of resistors $R_4$, $R_5$, and $R_6$, direct current voltage $V_{bb}$, and capacitor $C_{13}$. The output voltage associated with the collector of transistor $T_3$ is transferred to the base of transistors $T_4$ and $T_5$ for biasing purposes. The voltage associated with the collector of transistor $T_3$ is transferred to the base of transistor $T_4$ by means of inductors $L_{10}$ and $L_{15}$. Capacitors $C_{14}$ and $C_{15}$ shunt any undesired alternating current to ground. The transfer of voltage from the collector of transistor $T_3$ to the base of transistor $T_5$ is accomplished by inductors $L_9$ and $L_{15}$. Direct current voltage $V_{cc}$ is transferred to the collectors of transistors $T_4$ and $T_5$ for biasing purposes. This transfer of voltage to the collector of transistor $T_4$ is accomplished by inductors $L_{16}$ and $L_{11}$. Capacitors $C_{20}$ and $C_{21}$ shunt any undesired alternating current to ground. The transfer of voltage from voltage source $V_{cc}$ to the collector of transistor $T_5$ is accomplished by means of inductors $L_{12}$ and $L_{16}$.

The output tuned circuit 24 associated with this high power stage 14 includes inductors $L_{13}$ and $L_{14}$ and capacitors $C_{18}$ and $C_{19}$. The output signal of this output tuned circuit 24 is then connected to a hybrid circuit $H_2$. Hybrid circuit $H_2$ converts the signal from a balance type signal to a single ended signal. The output of hybrid $H_2$ is then connected to capacitor $C_{22}$ for direct current blocking purposes. The output of capacitor $C_{22}$ is the radio frequency power output signal associated with the two stage radio frequency power amplification device 10.

The method of the present invention can best be understood by way of a simplified example. With reference to FIG. 1, one would select element values for inductors $L_7$, $L_8$, $L_{14}$, and $L_{13}$ along with element values for capacitors $C_{16}$, $C_{17}$, $C_{18}$, and $C_{19}$ in order to maximize the power output, efficiency, and linearity of the high power stage 14 of this radio frequency power amplifier. In practice this is accomplished by applying an input test signal made up of two equal amplitude sine waves whose frequencies are slightly offset to the high power output stage 14. As the power level of the input is increased, the level of the output signal and intermodulation components are measured. The results of a typical measurement are shown in FIG. 2 as curve set 1. As an example, the required output power, which is specified by the application, is also indicated in the figure. Other tuning and bias conditions will provide the same output power for different levels of input power, direct current to radio frequency conversion efficiencies, and carrier to intermodulation power ratios as indicated in the figure as curve sets 2 and 3. For each selection of element values for the input and output tuned circuits 16, 18 of the high power stage 14, the intermodulation power as a function of input power relationship shows a null as input power is increased. The phase of the intermodulation products for input levels below the null is opposite to the phase above the null as portrayed by the "+" and "−" symbols in FIG. 2. As the high power stage is optimized for higher output power, the null shifts to the right and the intermodulation characteristic behaves as shown in FIG. 2. The tuning of the high power stage is based on selecting the best compromise between the direct current to radio frequency conversion efficiency and the carrier to intermodulation power ratio. This tuning results in placing the null to the right of the point where the output signal reaches the required output power level. Using this criterion, the tuning corresponding to curve 2 would be selected, since the intermodulation null is to the right of this point where the output signal reaches the required output power level.

Once these elements have been selected and the efficiency, linearity, and power output of the stage 14 has been optimized one would then select element values for the input and output tuned circuits 16, 18 of the driver stage 12. These circuits are comprised of inductors $L_5$ and $L_6$ and capacitors $C_5$, $C_6$, $C_9$, and $C_{10}$. The values of these elements are chosen to cause the intermodulation distortion output components associated with the driver stage 12 to be at a 180° phase angle from the intermodulation distortion output components associated with the high power stage 14. These intermodulation output components of the driver stage 12 will cancel the intermodulation output components in the high power stage 14. This cancellation of intermodulation output components will result in the overall radio frequency power amplification device 10 having a greater linearity and greater efficiency than before.

In practice this is accomplished by having the driver stage amplifier initially designed and characterized using the same procedure as the output stage. The family of signal input, output, and intermodulation characteristics for the various tunings and bias condition is determined. The tuning and bias condition selected for the driver state is that which produces the necessary output power with the intermodulation power null to the left of the desired operating point. Thus, the intermodulation products resulting from the driver stage are in phase opposition to those of the output stage over the operating region. Note the null to the left of the operating point. The resultant operational characteristics of the two stage amplifier is shown in FIG. 4. For power input levels between the two nulls the output intermodulation components of the two stage amplifier will be reduced or eliminated because the associated intermodulation output components of the driver (input) stage and the output stage are of opposite phase in this region of operation as indicated by the "+" and "−" symbols.

The following Table I sets forth representative values and descriptions of some of the elements of device 10 that have provided satisfactory results.

TABLE I

| Item | Description/Value |
|---|---|
| (1.) Driver Stage | |
| $T_2$ | MRA 0204-60VH |
| $C_5$ | 2.6 p.f. |
| $C_6$ | 18 p.f. |

TABLE I-continued

| Item | Description/Value |
|---|---|
| $L_5$ | 16 n.h. |
| $C_9$ | 71 p.f. |
| $C_{10}$ | 7.5 p.f. |
| $L_6$ | 13.5 n.h. |
| (2.) Output Stage | |
| $T_4$ | MRT 0204-110V |
| $T_5$ | MRT 0204-110V |
| $C_{16}$ | 18 p.f. |
| $C_{17}$ | 82 p.f. |
| $L_7$ | 7 n.h. |
| $L_8$ | 7 n.h. |
| $C_{18}$ | 150 p.f. |
| $C_{19}$ | 30 p.f. |
| $L_{13}$ | 13 n.h. |
| $L_{14}$ | 13 n.h. |

In view of the foregoing, it can be appreciated that the present invention enables the user to achieve high linearity and high efficiency of his multi-stage radio frequency power amplifier device by selecting values for internal components associated with the device. Thus, while this invention has been described in connection with a particular example thereof, no limitation is intended thereby except as defined by the following claims. This is because the skilled practitioner will realize that other modifications can be made without departing from the spirit of this invention after studying the specification and drawings.

What is claimed is:

1. In a radio frequency power amplifier circuit having a driver stage coupled to a high power stage, each stage having an input and an output which contains intermodulation distortion output components, the improvement comprising:
    circuit means for internally defining the intermodulation distortion components of the output of the driver stage such that such components are 180° out of phase with the intermodulation distortion components of the output of the high power stage whereby the intermodulation distortion component outputs of the two stages will subtract from or cancel each other.

2. The improvement of claim 1 wherein the circuit means comprises:
    two tuned circuits connected to a transistor in the driver stage, said tuned circuits having elements with values chosen to cause intermodulation component outputs of the said driver stage to cancel with intermodulation component outputs of the high power stage, and two tuned circuits connected to at least one transistor in the high power stage, said tuned circuits having elements with values chosen to optimize the high power stage for efficiency, linearity, and power output.

3. The improvement of claim 2 wherein the transistors are bipolar.

4. The improvement of claim 2 wherein the tuned circuits each comprises an inductive capacitive network.

5. The improvement of claim 2 wherein the high power stage is a push-pull amplifier.

6. The improvement of claim 1 wherein the driver stage and the high power stage of the radio frequency amplifier are connected together by means of a circulator device.

7. The improvement of claim 1 which further comprises hybrid circuit means connected to the output of the high power stage to convert an output signal of the high power stage from balanced to single ended and, hybrid circuit means connected to the input of the high power stage to balance the input signal.

8. The improvement of claim 2 wherein the transistors are FET's.

9. A power amplification circuit comprising:
    (a) a driver stage having an input and output, and including;
        (1) a transistor having an input and output;
        (2) an input tuned circuit connected to the input of said transistor;
        (3) an output tuned circuit connected to said output of said transistor;
        (4) biasing means connected to said transistor for biasing said transistor; and
        (5) capacitive circuit means connected to said input and to said output of said driver stage to block direct current;
    (b) a high power stage, having an input and output, and including:
        (1) capacitive circuit means connected to the input and to the output of the high power stage to block direct current;
        (2) a dual transistor push-pull amplifier circuit, having an input and output,;
        (3) an output tuned circuit having an input and output wherein said input is connected to the output of the push-pull dual transistor amplifier;
        (4) an input tuned circuit having an input and output wherein said output is connected to the input of the push-pull dual transistor amplifier;
        (5) biasing means for biasing the transistors in the dual transistor push-pull amplifier circuit; and
        (6) first hybrid circuit means connected to the input of the input tuned circuit to balance an input signal and second hybrid circuit means connected to the output of the output tuned circuit to convert an output signal from balanced to single ended;
    (c) a circulator device connecting the output of the driver stage to the input of the high power stage to provide electrical isolation; and
    (d) said tuned circuits in the driver stage having elemental values chosen to cause the intermodulation distortion components of the output of the driver stage to have a phase angle which is 180° opposite from the phase angle associated with the intermodulation distortion components of the output of the high power stage.

10. The power amplification circuit of claim 9 wherein the input and output tuned circuit of the driver stage are comprised of inductive-capacitive networks.

11. The power amplification circuit of claim 9 wherein the input and output tuned circuit of the high power stage comprise inductive—capacitive networks.

12. A method of combining stages of a multi-stage solid state radio frequency power amplifier together in order to eliminate intermodulation components associated therewith, said multi-stage amplifier containing a driver stage and a high power stage each having an input and output, and wherein said intermodulation components are attributable to the output of each of the individual stages, said method comprising:
    (a) tuning the high power stage for efficiency, linearity and power output; and
    (b) tuning the driver stage such that the intermodulation components which are produced are of alternate phase angle than the intermodulation components produced in the high power stage such that the intermodulation output components of the stages will subtract from each other or cancel.

13. The method of claim 12 which further comprises connecting an input and output tuned circuit to at least one transistor in said high power stage.

14. The method of claim 12 wherein said step (a) includes selecting element values of said input and output tuned circuit in order to optimize the efficiency, linearity and power output of said high power stage.

15. The method of claim 13 wherein said driver stage includes at least one transistor, with an input and output tuned circuit connected thereto.

16. The method of claim 14 wherein (b) includes the selection of element values for said input tuned circuit of the driver stage and values for said output tuned circuit of the driver stage in order to cause the phase angles of the intermodulation distortion output components associated with said driver stage to be at a 180° angle relative to the distortion output components of the high power stage.

* * * * *